US008597967B1

(12) United States Patent
Krames et al.

(10) Patent No.: US 8,597,967 B1
(45) Date of Patent: Dec. 3, 2013

(54) METHOD AND SYSTEM FOR DICING SUBSTRATES CONTAINING GALLIUM AND NITROGEN MATERIAL (75) Inventors: Michael R. Krames, Goleta, CA (US); Tai Margalith, Pleasanton, CA (US); Rafael Aldaz, Pleasanton, CA (US)

(73) Assignee: Soraa, Inc., Fremont, CA (US)

( * ) Notice: Subject to any disclaimer, the term of this patent is extended or adjusted under 35 U.S.C. 154(b) by 217 days.

(21) Appl. No.: 13/298,617

(22) Filed: Nov. 17, 2011

Related U.S. Application Data (60) Provisional application No. 61/414,817, filed on Nov. 17, 2010.

(51) Int. Cl.
*H01L 21/18* (2006.01)
*H01L 33/02* (2010.01)
*H01L 33/20* (2010.01)

(52) U.S. Cl.
USPC ...... 438/33; 257/615; 257/620; 257/E29.107; 257/E33.023; 438/460; 438/462

(58) Field of Classification Search
USPC ............. 257/615, 620, E29.107, E33.023; 438/33, 460, 462
See application file for complete search history.

(56) References Cited

U.S. PATENT DOCUMENTS

| 4,065,688 | A | 12/1977 | Thornton | |
|---|---|---|---|---|
| 5,813,753 | A | 9/1998 | Vriens et al. | |
| 6,468,882 | B2 * | 10/2002 | Motoki et al. | 438/460 |
| 7,208,096 | B2 * | 4/2007 | Akkipeddi et al. | 216/65 |
| 7,491,984 | B2 | 2/2009 | Koike et al. | |
| 7,535,082 | B2 * | 5/2009 | Nakayama et al. | 257/620 |
| 7,550,305 | B2 | 6/2009 | Yamagata et al. | |
| 7,598,104 | B2 | 10/2009 | Teng et al. | |
| 7,718,454 | B2 * | 5/2010 | Nakamura et al. | 438/30 |
| 7,786,488 | B2 * | 8/2010 | Nakayama et al. | 257/77 |
| 7,897,988 | B2 | 3/2011 | Chen et al. | |
| 8,008,165 | B2 * | 8/2011 | Nakayama et al. | 438/457 |
| 8,143,148 | B1 | 3/2012 | Raring et al. | |
| 8,148,180 | B2 | 4/2012 | Felker et al. | |
| 8,153,475 | B1 | 4/2012 | Shum et al. | |
| 8,268,643 | B2 * | 9/2012 | Matsumoto | 438/14 |
| 8,313,964 | B2 | 11/2012 | Sharma et al. | |
| 8,389,305 | B2 | 3/2013 | Felker et al. | |
| 2001/0043042 | A1 | 11/2001 | Murazaki et al. | |
| 2002/0028564 | A1 * | 3/2002 | Motoki et al. | 438/460 |

(Continued)

OTHER PUBLICATIONS

USPTO Office Action for U.S. Appl. No. 13/465,976 dated Dec. 20, 2012.

(Continued)

*Primary Examiner* — Evan Pert
(74) *Attorney, Agent, or Firm* — Kilpatrick Townsend & Stockton LLP (57) ABSTRACT

The present disclosure relates generally to semiconductor techniques. More specifically, embodiments of the present disclosure provide methods for efficiently dicing substrates containing gallium and nitrogen material. Additionally the present disclosure provide techniques resulting in a optical device comprising a substrate having three or more corners, where at least one of the corners is defined by a dislocation bundle characterized by a diameter of less than 100 microns, the gallium and nitrogen containing substrate having a predefined portion free from dislocation bundle centers, an active region containing one or more active layers, the active region being positioned within the predefined region; and a conductive region formed within the predefined region.

20 Claims, 5 Drawing Sheets

(56) References Cited

U.S. PATENT DOCUMENTS

| | | |
|---|---|---|
| 2003/0047076 A1 | 3/2003 | Liu |
| 2003/0178617 A1 | 9/2003 | Appenzeller et al. |
| 2004/0080256 A1 | 4/2004 | Hampden-Smith et al. |
| 2004/0116033 A1 | 6/2004 | Ouderkirk et al. |
| 2006/0240585 A1 | 10/2006 | Epler et al. |
| 2006/0256482 A1 | 11/2006 | Araki et al. |
| 2007/0045200 A1 | 3/2007 | Moon et al. |
| 2008/0030976 A1 | 2/2008 | Murazaki et al. |
| 2008/0081015 A1* | 4/2008 | Sarayama et al. ............ 423/409 |
| 2008/0121916 A1 | 5/2008 | Teng et al. |
| 2009/0081857 A1 | 3/2009 | Hanser et al. |
| 2009/0086475 A1 | 4/2009 | Caruso et al. |
| 2009/0315965 A1 | 12/2009 | Yamagata et al. |
| 2010/0327291 A1* | 12/2010 | Preble et al. ................... 257/76 |
| 2011/0281422 A1 | 11/2011 | Wang et al. |
| 2011/0309373 A1 | 12/2011 | Sharma et al. |
| 2012/0135553 A1 | 5/2012 | Felker et al. |
| 2012/0178198 A1 | 7/2012 | Raring et al. |
| 2013/0022758 A1 | 1/2013 | Trottier |

OTHER PUBLICATIONS

USPTO Notice of Allowance for U.S. Appl. No. 13/163,498 dated Jul. 23, 2012.

USPTO Office Action for U.S. Appl. No. 13/465,976 dated Aug. 16, 2012.

USPTO Notice of Allowance for U.S. Appl. No. 13/419,325 dated Dec. 4, 2012.

USPTO Office Action for U.S. Appl. No. 12/858,379 dated Apr. 14, 2011.

USPTO Notice of Allowance for U.S. Appl. No. 12/858,379 dated Dec. 6, 2011.

USPTO Notice of Allowance for U.S. Appl. No. 13/184,160 dated Dec. 12, 2011.

USPTO Notice of Allowance for U.S. Appl. No. 13/419,325 dated Feb. 1, 2013.

USPTO Office Action for U.S. Appl. No. 13/425,354 dated Feb. 14, 2013.

* cited by examiner

METHOD AND SYSTEM FOR DICING SUBSTRATES CONTAINING GALLIUM AND NITROGEN MATERIAL

CROSS-REFERENCE

This application claims priority to U.S. Provisional Application No. 61/414,817, filed Nov. 17, 2010 which is incorporated by reference in entirety herein.

FIELD

The present disclosure relates generally to semiconductor techniques, more particularly, methods for efficiently dicing substrates containing gallium and nitrogen material.

BACKGROUND

The present disclosure relates generally to semiconductor techniques. More specifically, embodiments of the present disclosure provide a method and system for efficiently dicing substrates containing gallium and nitrogen material. Gallium and nitrogen containing substrates are often used in the manufacturing LEDs, lasers, and other devices, and are typically formed by crystal growth methods and contain high-dislocation areas that are not usable in manufacturing devices. In various embodiments, this disclosure provides techniques for dicing substrates based on patterns of the high-dislocation areas.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb eventually fails due to evaporation of the tungsten filament.

To overcome some of the drawbacks of the conventional light bulb, fluorescent lighting has been developed. Fluorescent lighting uses an optically clear tube structure filled with a noble gas and typically also contains mercury. A pair of electrodes is coupled between the gas and to an alternating power source through a ballast device. Once the mercury has been excited, it discharges to emit UV light. Typically, the optically clear tube is coated with phosphors, which are excited by the UV light to provide white light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Modern red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid-state white lighting, the blue laser diode, which in turn enabled the Blu-Ray™ DVD player (trademark of the Blu-Ray Disc Association), and other developments. Blue, violet, or ultra-violet-emitting devices based on InGaN are used in conjunction with phosphors to provide white LEDs. Other colored LEDs have also been proposed.

InGaN and GaN based devices, such as LED and laser devices, are often manufactured from substrates that are formed by crystal growth processes. Various conventional techniques have been used in the past to use this type of substrate. Unfortunately, the conventional techniques are often inadequate, either providing an average dislocation density that is too high for device reliability, or in the case of very low-dislocation-density substrates, the presence of localized high-dislocation density regions (e.g., dislocation bundles) which are deleterious to device performance.

The organization of the dislocation bundles may demand the herein disclosed dicing techniques in order to optimize utilization of the substrate (e.g., dicing in a manner so as to produce the desired devices, while eliminating or reducing waste).

Therefore, it is desirable to have improved techniques for processing devices from such substrates.

BRIEF SUMMARY

The present disclosure provides a method for processing substrates. The method comprises providing a substrate which includes gallium and nitrogen material. The substrate includes a plurality of high-dislocation-density regions, so-called "core" regions. The plurality of dislocation bundle centers is aligned according to a predetermined pattern. The method also includes locating at least a first dislocation bundle center and a second dislocation bundle center. The method further includes defining a first line that connects at least the first dislocation bundle center and the second dislocation bundle center. The first line is substantially straight. The method also includes locating a third dislocation bundle center. The method further includes defining a second line that connects at least the first dislocation bundle center and the third dislocation bundle center. The second line is substantially straight. The method also includes cutting the substrate along the first line and cutting the substrate along the second line. One method includes forming a device that has a first edge formed by cutting the substrate along the first line.

In various embodiments, the present disclosure provides for optical devices manufactured using the substrate described above. As an example, the substrate comprises GaN material, and the optical devices can be LED devices or laser devices. The optical device includes a substrate portion that comprises three or more corners, and two or more dicing passes may be performed in order to scribe along each edge of an optical device. For example, a triangular substrate comprises three corners, while a square substrate comprises four corners. Depending on the substrate portion shape, the substrate portion can have a number of corners. Each of the corners includes at least a dislocation bundle center characterized by a diameter of less than 50 microns. The substrate includes a predefined region free from cores. The optical device includes an active region containing one or more active layers, and the active region is positioned within the predefined region. The optical device also includes a conductive region formed within the predefined region. A further understanding of the nature and advantages of the present disclosure may be realized by reference to the latter portions of the specification and attached drawings.

DETAILED DESCRIPTION OF THE INVENTION

According to the present invention, among other things, gallium and nitrogen containing substrates are often used in manufacturing LED, laser, and other types of devices. Gallium and nitrogen containing substrates are typically formed by crystal growth methods and contain high-dislocation areas that are not usable in manufacturing devices. In various embodiments, the present disclosure provides techniques for dicing substrates based on patterns of the high-dislocation areas. There are other embodiments as well.

As mentioned above, conventional techniques for processing substrates are often inadequate. More specifically, GaN substrates often contain high-dislocation-density regions that should not be used in forming devices as they may be detrimental to performance or reliability. However, such regions may be controlled geometrically. For example, cores in GaN substrates are described in The Journal of Crystal Growth 305 (2007) pp. 377-383, which is incorporated by reference herein for all purposes. As used herein, the term "cores" refers to high-dislocation regions. For example, dislocation bundles (e.g., cores) are formed during crystal growth processes and may be oriented in an ordered pattern on the substrate according to lithographical masking and growth processes employed for GaN growth such as the hydride vapor phase epitaxy (HVPE) process.

Figure 1:
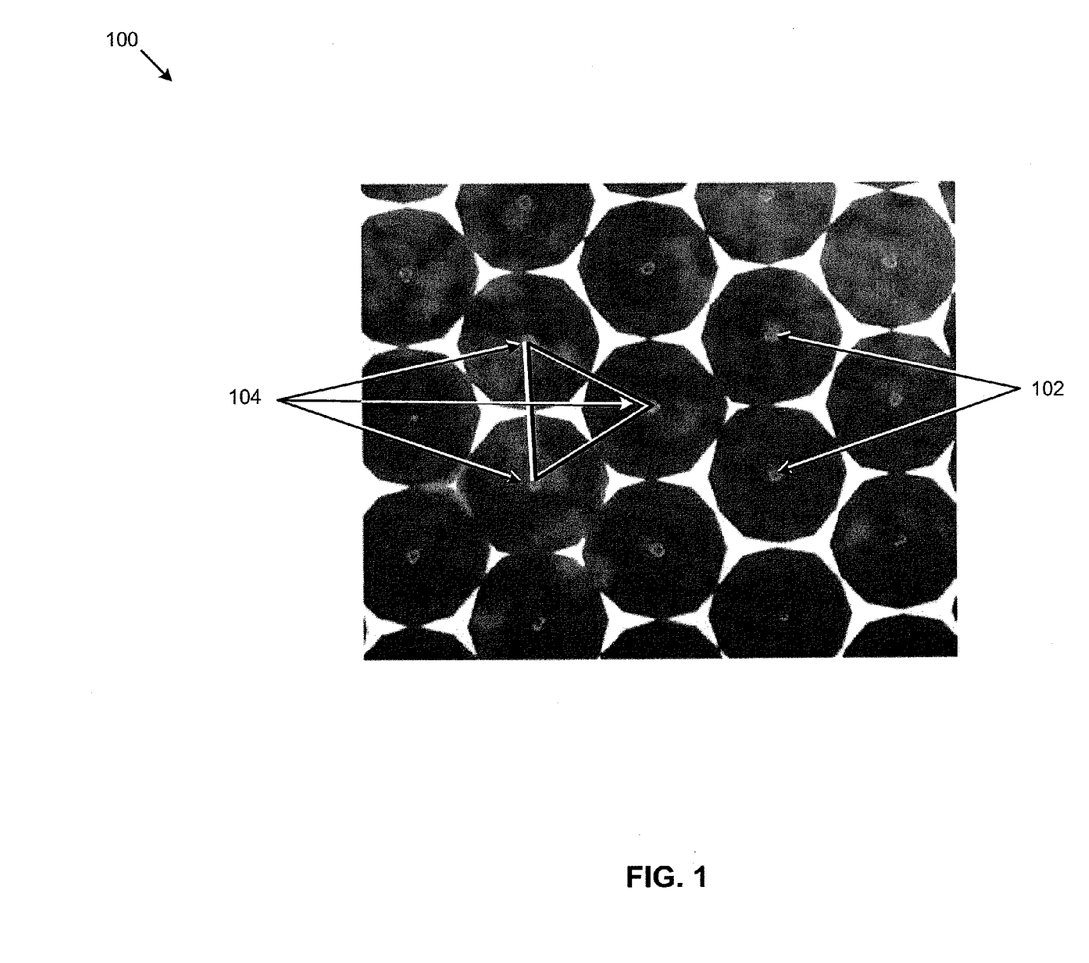
FIG. 1 is a simplified diagram illustrating a substrate having patterned dislocation bundle centers, according to some embodiments.

FIG. 1 is a simplified diagram 100 illustrating a substrate having patterned dislocation bundle centers. As shown in FIG. 1, the dislocation bundle centers 102 are aligned. The regions between cores are "non-core" regions that have lower dislocation density. Usually, regions around (but not including) the dislocation bundles (e.g., the non-dislocation bundles) are suitable for making devices, such as LED devices and laser devices. It is to be appreciated that various embodiments of the present disclosure provide techniques for efficiently dicing substrates that have patterned dislocation bundle centers. In various embodiments, the non-dislocation bundle centers may be intentionally doped (e.g., with silicon, oxygen, germanium) to provide a desired level of conductivity. According to the dicing techniques described herein very little substrate material is removed during the dicing process, and the dislocation bundle centers become the corner areas of the devices that are formed by dicing the substrate and, in so doing, three or more corners 104 are formed.

In various embodiments, the substrate or die area is aligned. During the dicing process, the dislocation bundle centers are substantially removed (i.e., as part of the kerf loss in the dicing process). As a result, the removed dislocation bundle centers are not a part of the active device region. In another embodiment, the dislocation bundle centers are masked off so that they are not electrically injected during device operation. It is to be appreciated that these approaches help avoid the dislocation bundle centers having an impact to the active device material, thereby allowing for high performance, high-reliability, and long-lived device operation.

In various embodiments, the dislocation bundle centers are arranged according to the underlying mask on the GaAs wafer prior to HVPE growth of GaN. As a result, various pattern arrangements are possible such optical devices can be shaped with three or more corners.

Figure 2:
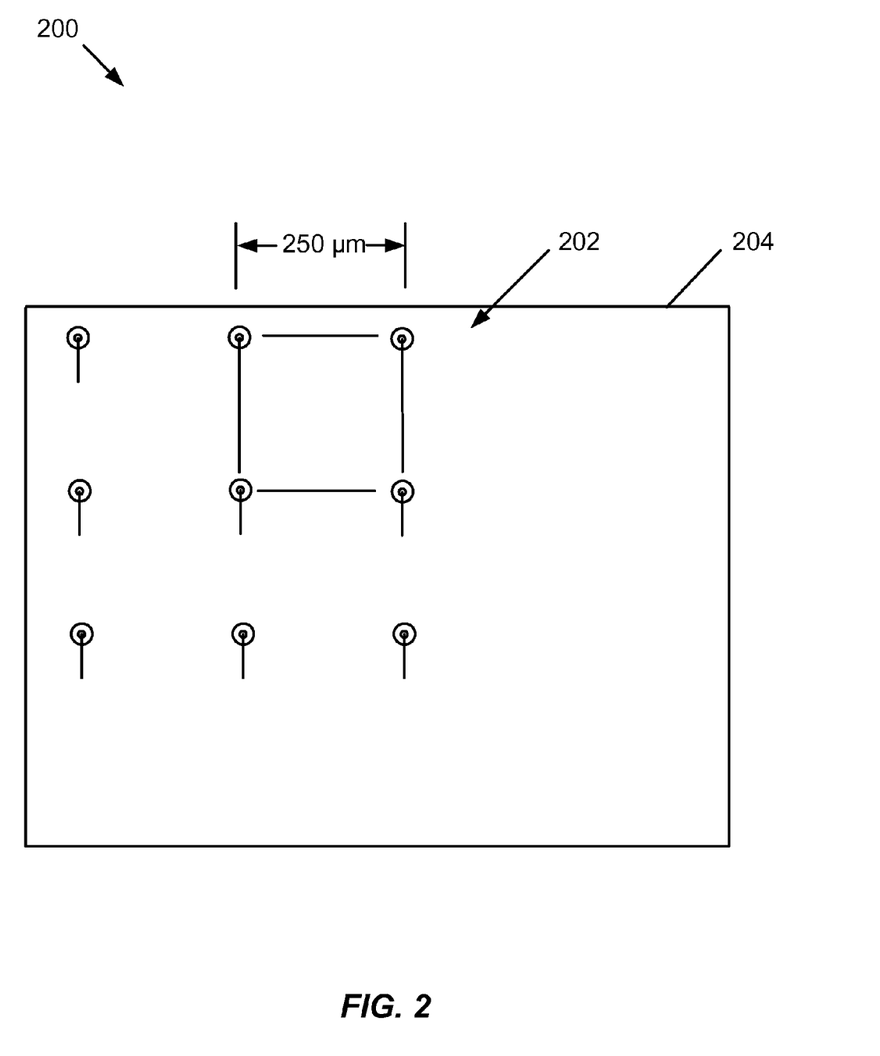
FIG. 2 is a simplified diagram illustrating techniques for dicing a substrate, according to some embodiments.

FIG. 2 is a simplified diagram 200 illustrating techniques for dicing a substrate. This diagram is merely an example, which should not unduly limit the scope of the claims. One of ordinary skill in the art would recognize many variations, alternatives, and modifications.

As shown in FIG. 2, dislocation bundle centers on the substrate 204 are aligned in a square lattice configuration 202. To form devices, the substrate shown in FIG. 2 is diced along the lines defined by the dislocation bundle centers. For example, a square-shaped or rectangular-shaped device having one side length of about 250 microns is formed by dicing the substrate through the dislocation bundle centers. Each side of the device is defined by two adjacent dislocation bundle centers.

Figure 3:
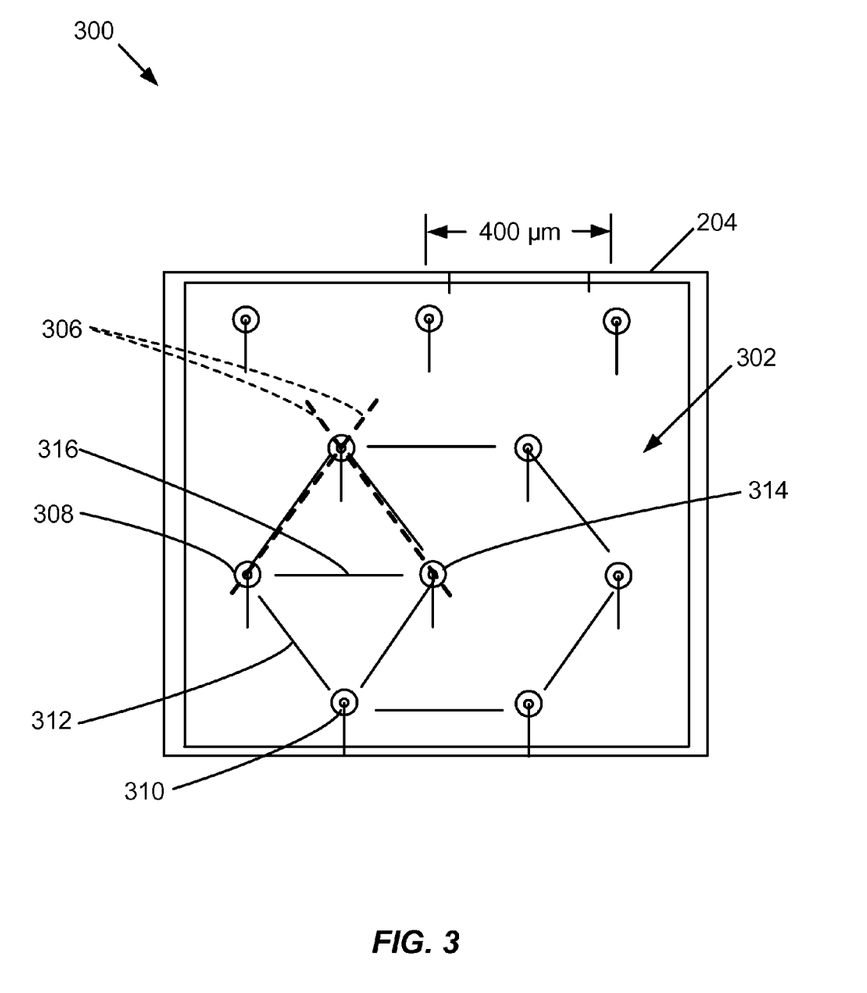
FIG. 3 is a simplified diagram illustrating techniques for dicing a substrate having dislocation bundle centers in hexagonal pattern, according to some embodiments.

It is to be appreciated that depending on the pattern of the dislocation bundle centers, devices can be diced into other shapes as well, such as a diamond shape, a triangular shape, etc. FIG. 3 is a simplified diagram 300 illustrating techniques for dicing a substrate having dislocation bundle centers in a hexagonal pattern. This diagram is merely an example, which should not unduly limit the scope of the claims. One of ordinary skill in the art would recognize many variations, alternatives, and modifications.

As shown in FIG. 3, dislocation bundle centers are evenly spaced and aligned horizontally and diagonally. It is to be appreciated that according to embodiment of the present disclosure, a hexagonal core pattern 302 is diced for triangular- or diamond-shaped devices. Depending on the application, diamond or triangular shaped devices can provide advantages in light extraction efficiency.

According an embodiment, the present disclosure provides a method for processing substrates. The method includes providing a substrate 204, which substrate comprises gallium and nitrogen material. For example, the substrate is a GaN based substrate formed by crystalline growth processes. Depending on the application, the substrate surface may be configured in a polar, non-polar, or semi-polar orientation. The substrate has a plurality of dislocation bundle centers. In certain embodiments, the substrate is polished after the growing process. As explained above, the dislocation bundle centers are formed during the crystal growth process. For example, the dislocation bundle centers comprise high dislocation densities and are unsuitable for making devices.

The dislocation bundle centers are aligned according to a predetermined pattern, which is typically based on the pattern of mask that is used to grow the substrate. Depending on the application, the pattern can be square (as shown in FIG. 2), hexagonal (as shown in FIG. 3), or others. For example, dislocation bundle centers are spaced about 100 to 1500 microns from one another. Depending on the growth process and tools used, the dislocation bundle centers can be 10 to 100 microns in diameter. In certain embodiments, the dislocation bundle centers can be doped with oxygen, and the core-free regions are silicon doped to make it n-type.

As explained above, to conserve valuable substrate regions that are free from the dislocation bundle centers, dicing of the substrate is performed along dicing lines 306 that pass through the dislocation bundle centers. In an embodiment, a first dislocation bundle center 308 and a second dislocation bundle center 310 are located. A first line 312 is defined. The first line 312 connects at least the first dislocation bundle center and the second dislocation bundle center, and the first line being substantially straight. To dice the substrate to form a number of devices, additional lines that pass through dislocation bundle centers are defined. In an embodiment, a third dislocation bundle center 314 is located. A second line 316 is defined. The second line 316 connects at least the first dislocation bundle center and the third dislocation bundle center, and the second line 316 is substantially straight. As shown in this example, the second line can be at a non-perpendicular angle to the first line, and the device defined by the first and the second lines is triangular or diamond shaped. It is to be appreciated that other shapes are possible as well. For example, following the square lattice configuration 202 of FIG. 2, the second line can be perpendicular to the first line.

Dicing of substrates is performed along at least the first and second lines. Depending on the application, various methods can be used for dicing. For example, diamond scribing, breaking, cutting, and other techniques or combinations thereof can be used for dicing the substrate into die having straight edges. Further, dicing can be accomplished by laser scribing, laser ablation of the substrate, stealth laser dicing, and/or other laser scribing techniques, followed by a breaking (e.g., mechanical breaking along the scribe lines). Where scribing or breaking methods are used, very little substrate material is removed during the dicing process, and the dislocation bundle centers become the corner areas of the devices that are formed by dicing the substrate and, in so doing, three or more corners 104 are formed. In certain laser scribing processes, up to about 30 microns of material are removed by the laser while about 10 microns of material is lost at cleaving. Two or more dicing passes may be performed in order to scribe along each edge of a device. Using the diamond scribing process, the material loss can be as low as 10 microns. In various types of sawing processes, about 20 to 100 microns of material are lost. In various embodiments, substrates are diced through the dislocation bundle centers, which may be substantially removed or partially removed depending on the amount of material being removed during the dicing process. In a specific embodiment, dicing is accomplished by an etching process, where an etching mask exposes the dislocation bundle centers completely so that the dislocation bundle centers are etched away.

Figure 5A:
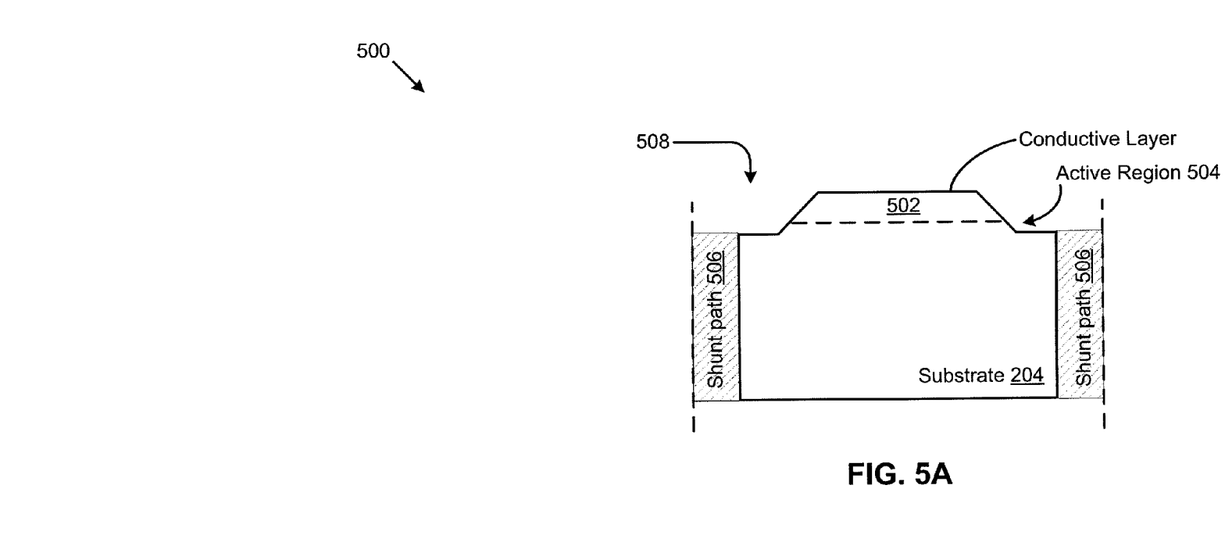
FIG. 5A is a side view of an optical device showing a portion of a conductive layer, according to some embodiments.

Depending on the size of the substrate, device geometry, and dislocation bundle center patterns, the substrate can be diced a number of times, and a number of devices are formed. In a device formed according to embodiments of the present disclosure, the device has at least a first corner, a second corner, and a third corner. The dislocation bundle centers are positioned on each of the corners of the device. To further process the device, a conductive region is defined on the device (see FIG. 5). The area where the conductive region is formed substantially free from dislocation bundle centers and thus can be used for forming active and conductive regions of the device. For example, active layers are formed within the active region. In certain embodiments, the device is polished.

In some embodiments, the dislocation bundle centers can be considered to be at or near the center of the devices, and a particular configuration of device geometry based on the dislocation bundle center patterns can determine the pattern, according to which pattern the substrate is diced. Such patterns allow to dice to be formed from the wafers in many configurations. Still further, other configurations of dislocation patterns (e.g., such as stripes instead of center-distributed sites) are reasonable and envisioned, and devices can be formed using the dicing techniques described herein.

In certain embodiments, the dicing of substrate involves cutting the substrate (e.g., using mechanical cutting tools). For example, a thickness of up to 35 microns or more of substrate material may be removed (e.g., kerf loss) during the cutting process. The cutting processes themselves can cause removal of substrate material, and the removed substrate material can include all or a portion of the substrate forming a shunt. As mentioned above, dislocation bundle centers are typically characterized by a diameter of less than 50 microns. As a result of the material loss during the cutting process, the dislocation bundle centers are effectively removed. In such case, the devices formed by cutting the substrate are substantially free from dislocation bundle centers, and substantially all of the entirety of the device's areas can be used for forming active and conductive regions. The devices resulting from dicing the substrate can be used for various applications. For example, with further processing, the devices can be used to form LED and/or laser devices.

It is to be appreciated that the various processes and/or steps described above for forming dicing substrates and forming devices are not limiting. For example, various processes and/or steps can be added, removed, replaced, re-arranged, repeated, overlapped, and/or modified. In an embodiment, corners of the device that include dislocation bundle center are masked when the device is further processed.

In various embodiments, the present disclosure provides an optical device manufactured using the substrate described above. As an example, the substrate comprises GaN material and, for example, the optical device can be LED or laser devices. The optical device includes a substrate that comprises three or more corners. For example, a triangular substrate comprises three corners, while a square substrate comprises four corners. Depending on the substrate shape, the substrate can have a larger number of corners. Each of the corners includes at least a dislocation bundle center characterized by a diameter of less than 50 microns. As explained above, dislocation bundle centers are typically intact if the substrate is diced by a scribing process. The substrate includes a predefined region free from dislocation bundle centers of the corners. The optical device includes an active region containing one or more active layers, and the active region is positioned within the predefined region. The optical device also includes a conductive region formed within the predefined region.

In some embodiments an optoelectronic device includes a substrate portion (from a substrate of the types described above) which is used for electrical injection into the active layers of the device. In such embodiments the non-dislocation bundle centers of the substrate are made conductive. This may be accomplished by intentionally doping the substrate layers during the substrate crystal growth process. Suitable dopants include silicon which may be provided by flowing silane or di-silane during the crystal growth process. Typically doping levels are in concentrations from 3 E17 cm-3 to 8 E18 cm-3, but may be higher.

Figure 4:
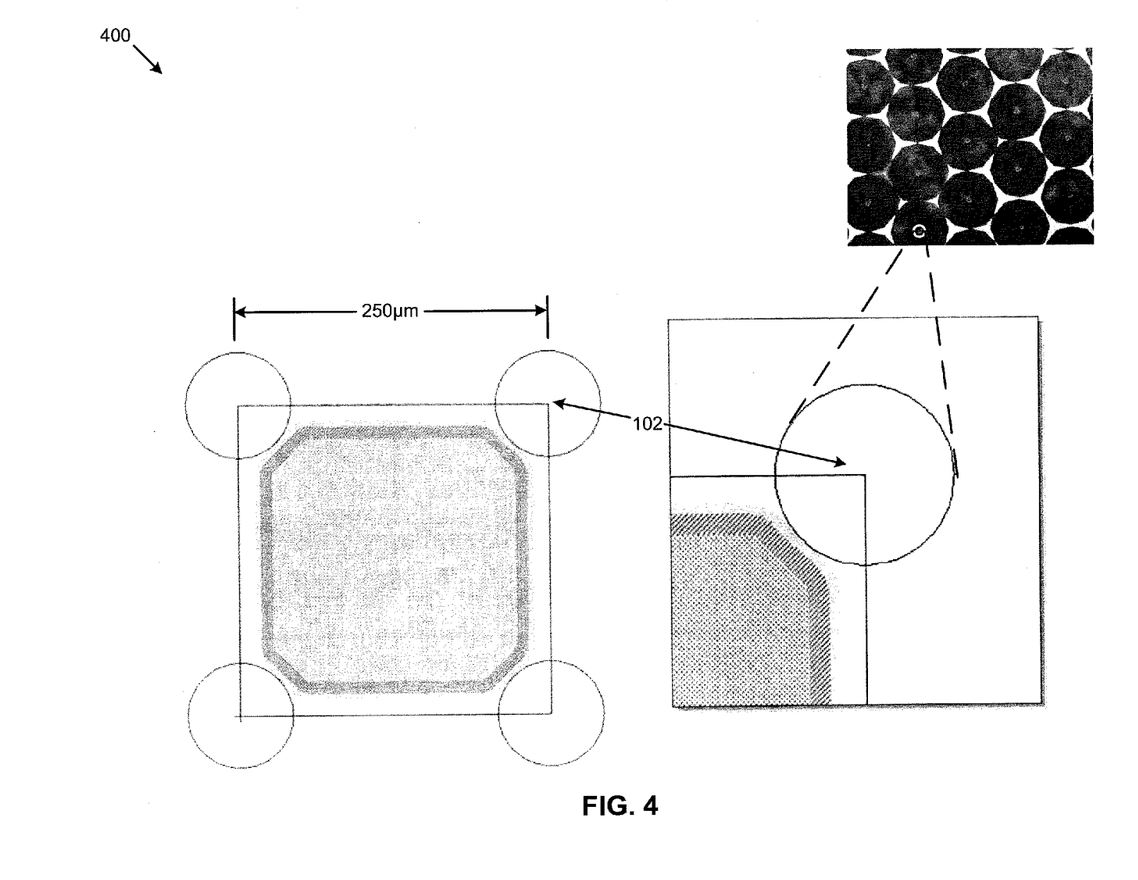
FIG. 4 is a plan view diagram of an electrical contact designed to confine electrical injection into a pre-defined region that avoids the dislocation bundle centers, according to some embodiments.

FIG. 4 is a simplified diagram 400 illustrating the substrate portion of an optoelectronic device. This diagram is merely an example, which should not unduly limit the scope of the claims. One of ordinary skill in the art would recognize many variations, alternatives, and modifications. As shown in FIG. 4, an exemplary substrate has a length of 250 μm. The dislocation bundle centers are located at the four corners of the substrate. The active regions of the device are to be formed at the non-dislocation bundle centers. In various embodiments, a die pattern (e.g., as defined by lithography, metal deposition, and/or etching) is 'dog-eared' (truncated) to avoid the dislocation bundle center in the substrates. This dog-eared shape substantially eliminates exposure to the shunt path (see shunt path 506 of FIG. 5).

FIG. 5A is a side view of an optical device 500 showing a portion of a conductive layer. As shown, the material around the dislocation bundle centers are substantially removed (e.g., see the area 508). More specifically, the side view shows that a conductive layer 502 is deposited atop the substrate, thus forming an active region 504. During the processes as described herein, a portion of the material is removed at or near the corners, and this has the effect to substantially eliminate exposure to the shunt path 506. The side view as shown in FIG. 5 depicts the dog-eared shape introduced above (see FIG. 4).

Figure 5B:
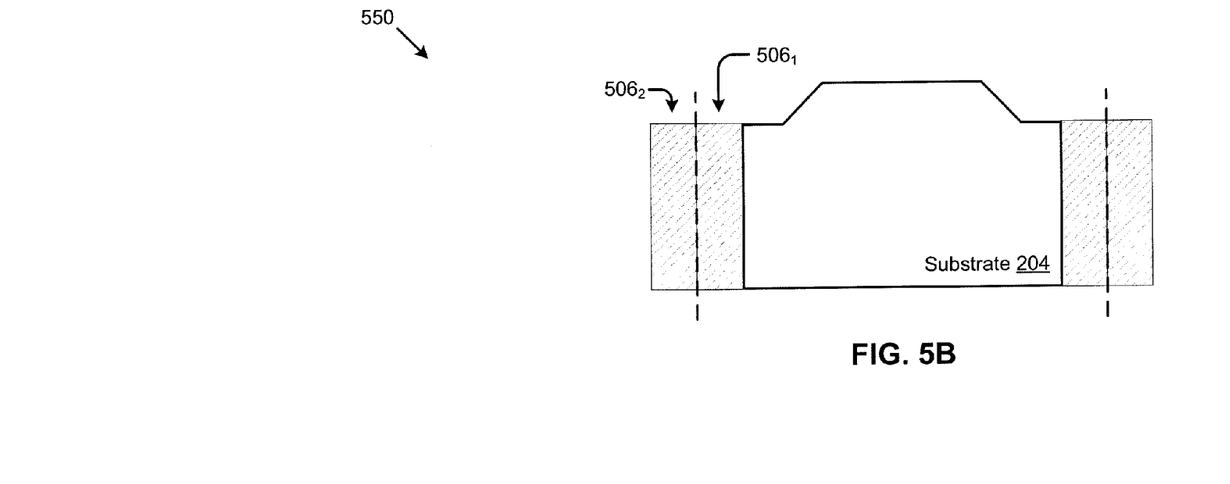
FIG. 5B is a side view of an optical device showing a juxtaposition to a shunt path, and a neighboring shunt path, according to some embodiments.

FIG. 5B is a side view of an optical device 550 showing a juxtaposition to a shunt path 506₁, and a neighboring shunt path 506₂. As shown, when the material around the dislocation bundle centers are substantially removed, this has the effect of substantially eliminating exposure to the shunt path for adjacent areas, which adjacent areas become neighboring devices after separation into individual die.

In a preferred embodiment, various techniques can be used to dice the substrate in accordance to the dislocation bundle center pattern. In other embodiments, the present specification describes one or more specific gallium and nitrogen containing surface orientations, but it would be recognized that any one of a plurality of family of plane orientations can be used. The above description and illustrations should not be taken as limiting the scope of the present disclosure which is defined by the appended claims.

What is claimed is:

1. An optical device comprising:
    a substrate, the substrate having three or more corners, at least one of the corners having at least one dislocation bundle characterized by a diameter of less than 100 microns, the substrate having a predefined portion free from dislocation bundle centers, the substrate containing gallium and nitrogen material;
    an active region containing one or more active layers, the active region being positioned within the predefined region; and
    a conductive region formed within the predefined region.

2. The optical device of claim 1, wherein the substrate is characterized by a substantially triangular shape.

3. The optical device of claim 1, wherein the substrate is characterized by a substantially rectangular shape.

4. The optical device of claim 1, wherein the substrate is characterized by a substantially diamond shape.

5. The optical device of claim 1, wherein the substrate is characterized by a substantially square shape.

6. The optical device of claim 1, wherein at least one edge of the substrate is formed by a scribing process.

7. The optical device of claim 1, wherein the predefined region comprises a least a portion of the region characterized by a conductivity of at least 3 E17 $cm^{-3}$.

8. A method for manufacturing optical devices comprising:
    providing a substrate, the substrate comprising gallium and nitrogen material, the substrate having a plurality of dislocation bundle centers, the plurality of dislocation bundle centers being aligned according to a predetermined pattern;
    locating at least a first dislocation bundle center and a second dislocation bundle center;
    defining a first line, the first line connecting at least the first dislocation bundle center and the second dislocation bundle center, the first line being substantially straight;
    locating a third dislocation bundle center;
    defining a second line, the second line connecting at least the first dislocation bundle center and the third dislocation bundle center, the second line being substantially straight;
    dicing the substrate along the first line;
    dicing the substrate along the second line;
    forming the optical device, the optical device having at least a first corner, and second corner, and a third corner, with a dislocation bundle center being positioned substantially at least one of the first corner, the second corner, and the third corner; and
    defining a conductive region on the optical device, the conductive region being free from dislocation bundle centers.

9. The method of claim 8, further comprising forming active layers on the optical device.

10. The method of claim 8, further comprising forming a cutting pattern based on the predetermined pattern, the cutting pattern comprising a plurality of substantially straight lines.

11. The method of claim 8, wherein the optical device is characterized by a triangular shape.

12. The method of claim 8, further comprising breaking the substrate along the first line.

13. A method for manufacturing optical devices comprising:
    providing a substrate, the substrate comprising gallium and nitrogen material, the substrate having a plurality of dislocation bundle centers, the plurality of dislocation bundle centers being aligned according to a predetermined pattern;
    locating at least a first dislocation bundle center and a second dislocation bundle center;
    defining a first line, the first line connecting at least the first dislocation bundle center and the second dislocation bundle center, the first line being substantially straight;
    locating a third dislocation bundle center;
    defining a second line, the second line connecting at least the first dislocation bundle center and the third dislocation bundle center, the second line being substantially straight;
    cutting the substrate along the first line;
    cutting the substrate along the second line; and
    forming the optical device, the optical device having a first edge formed by cutting the substrate along the first line.

14. The method of claim 13, wherein each of the dislocation bundle centers is characterized by a diameter of less than 50 microns.

15. The method of claim 13, wherein cutting the substrate along the first line removes a portion of substrate material, the portion of substrate material being characterized by a thickness of at least 30 microns.

16. The method of claim 13, further comprising forming an active region on the optical device.

17. The method of claim 13, further comprising forming a conductive region.

18. The method of claim 13, further comprising cutting the substrate along a third line, the third line being substantially straight and connecting at least the second dislocation bundle center and the third dislocation bundle center.

19. The method of claim 13, further comprising forming an LED using the optical device.

20. The method of claim 13, further comprising forming a laser using the optical device.

* * * * *